United States Patent
Watanabe

(10) Patent No.: US 6,608,854 B1
(45) Date of Patent: Aug. 19, 2003

(54) METHOD, DEVICE, AND SYSTEM FOR WAVEFORM SHAPING OF SIGNAL LIGHT

(75) Inventor: Shigeki Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/571,384

(22) Filed: May 15, 2000

(30) Foreign Application Priority Data

May 14, 1999 (JP) .......................................... 11-133576

(51) Int. Cl.[7] .................................................. H01S 3/08
(52) U.S. Cl. ........................................... 372/96; 372/31
(58) Field of Search ............................. 372/25–32, 31, 372/96

(56) References Cited

U.S. PATENT DOCUMENTS

| | | | | |
|---|---|---|---|---|
| 5,432,632 A | * | 7/1995 | Watanabe | 359/191 |
| 5,515,192 A | * | 5/1996 | Watanabe | 359/124 |
| 5,596,667 A | * | 1/1997 | Watanabe | 385/122 |
| 5,751,758 A | * | 5/1998 | Kuwatsuka | 372/96 |
| 5,798,853 A | * | 8/1998 | Watanabe | 359/160 |
| 5,896,211 A | * | 4/1999 | Watanabe | 359/124 |
| 5,920,588 A | * | 7/1999 | Watanabe | 372/96 |
| 5,926,297 A | * | 7/1999 | Ishikawa et al. | 359/115 |
| 6,307,984 B1 | * | 10/2001 | Watanabe | 385/24 |

* cited by examiner

Primary Examiner—Paul Ip
Assistant Examiner—Tuan Nguyen
(74) Attorney, Agent, or Firm—Staas & Halsey LLP

(57) ABSTRACT

The present invention relates to a method, device, and system for waveform shaping of signal light. The device for waveform shaping of signal light according to the present invention includes a distributed feedback (DFB) laser having a stop band defined as the range of wavelengths allowing laser oscillation, and a drive circuit for supplying a drive current to the DFB laser so that the DFB laser oscillates at a first wavelength included in the stop band. Signal light having a second wavelength not included in the stop band is input into the DFB laser. In the case that the signal light is provided by optical pulses each having a high level and a low level, amplitude fluctuations at the high level of the signal light can be effectively suppressed by suitably setting the power of the signal light.

30 Claims, 11 Drawing Sheets

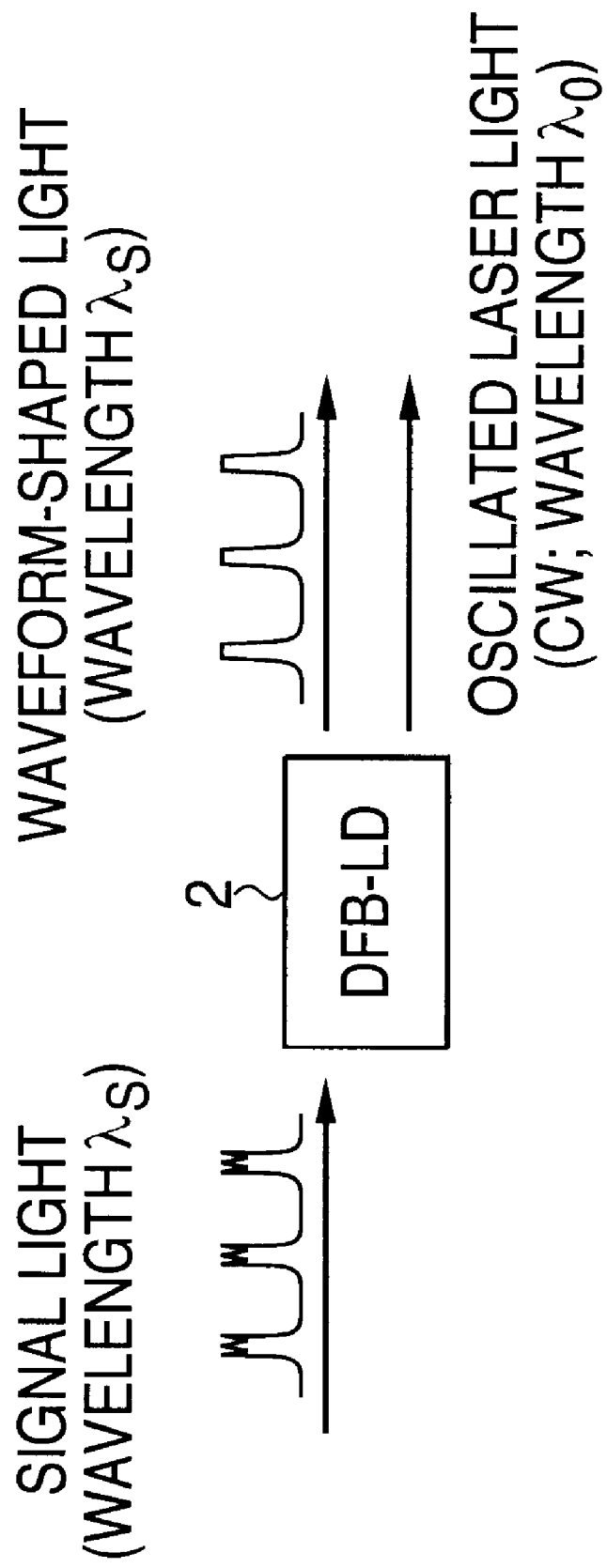

METHOD, DEVICE, AND SYSTEM FOR WAVEFORM SHAPING OF SIGNAL LIGHT

CROSS-REFERENCE TO RELATED APPLICATIONS

This application is based on, and claims priority to, Japanese patent application number 11-133576, filed on May 14, 1999, in Japan, and which is incorporated herein by reference.

This application is related to U.S. application Ser No. 09/217,018, filed Dec. 21, 1998, now U.S. Pat. No. 6,424,773, Ser. No. 09/386,847 and Ser. No. 09/456,821, filed Dec. 8, 1999, now U.S. Pat. No. 6,424,774, which are incorporated herein by reference.

BACKGROUND OF THE INVENTION

1. Field of the Invention

The present invention relates to a method, device, and system for waveform shaping of signal light.

2. Description of the Related Art

In an optical fiber communication system that has been put to practical use in recent years, a reduction in signal power due to transmission line loss, coupling loss, etc. is compensated by using an optical amplifier such as an erbium doped fiber amplifier (EDFA). The optical amplifier is an analog amplifier, which functions to linearly amplify a signal. In this kind of optical amplifier, amplified spontaneous emission (ASE) noise generated in association with the amplification is added to cause a reduction in signal-to-noise ratio (S/N ratio), so that the number of repeaters is limited to result in the limit of a transmission distance. Further, waveform degradation due to the chromatic dispersion owned by an optical fiber and the nonlinear optical effects in the fiber is another cause of the transmission limit. To eliminate such a limit, a regenerative repeater for digitally processing a signal is required, and it is desirable to realize such a regenerative repeater. In particular, an all-optical regenerative repeater capable of performing all kinds of signal processing in optical level is important in realizing a transparent operation independent of the bit rate, pulse shape, etc. of a signal.

The functions required for the all-optical regenerative repeater are amplitude restoration or reamplification, timing restoration or retiming, and waveform shaping or reshaping. Of these functions, special attention is paid to the reshaping function in the present invention to provide an ultra high-speed waveform shaping device having a simple configuration by using a distributed feedback (DFB) laser in its saturated operational condition.

The most general one of conventional waveform shapers is an optoelectric (OE) type waveform shaper so designed as to once convert input signal light into an electrical signal by using a photodetector such as a photodiode, next subject this electrical signal to electrical waveform shaping by using a logic circuit, and thereafter modulate laser light by the waveform-shaped signal. Such an OE type waveform shaper is used for a regenerative repeater in a conventional optical communication system. However, the operating speed of the OE type waveform shaper is limited by an electronic circuit for signal processing, so that the bit rate of an input signal to the regenerative repeater is fixed to a low rate.

On the other hand, as an all-optical waveform shaper capable of performing all kinds of processing in optical level, there has already been proposed various ones including a nonlinear switch accompanying wavelength conversion, such as a nonlinear optical loop mirror (NOLM) or a Michelson or Mach-Zehnder interferometer, and a switch employing a saturable absorber (see Japanese Patent Application No. 10-176316 for the related art).

SUMMARY OF THE INVENTION

It is therefore an object of the present invention to provide a novel method, device, and system for waveform shaping independent of the bit rate, pulse shape, etc. of signal light. Other objects of the present invention will become apparent from the following description.

In accordance with a first aspect of the present invention, there is provided a method for waveform shaping of signal light. In this method, a distributed feedback (DFB) laser having a stop band defined as the range of wavelengths allowing laser oscillation is first provided. The DFB laser is driven so as to oscillate at a first wavelength included in the stop band. Signal light having a second wavelength not included in the stop band is input into the DFB laser.

The driving of the DFB laser is performed, for example, by supplying a constant drive current to the DFB laser.

The signal light is provided, for example, by optical pulses each having a high level and a low level. In this case, amplitude fluctuations at the high level of the signal light are suppressed in the DFB laser by the application of the present invention. This suppression effect can be optimized by adjusting the power of the signal light to be input into the DFB laser.

According to the first aspect of the present invention, the waveform shaping of signal light can be performed without the need for opto/electric conversion or electro/optic conversion, so that it is possible to provide a novel method for waveform shaping independent of the bit rate, pulse shape, etc. of signal light.

Preferably, control light having a third wavelength not included in the stop band is input into the DFB laser. The control light has a substantially constant power, for example. By inputting the control light into the DFB laser, an excess increase in noise at the low level of the signal light is suppressed. This suppression effect can be optimized by adjusting the power of the control light.

The DFB laser has an output saturation characteristic as will be hereinafter described. The signal light is subjected to waveform shaping according to the output saturation characteristic to obtain waveform-shaped light, which is output from the DFB laser.

In accordance with a second aspect of the present invention, there is provided a method for waveform shaping of signal light. In this method, signal light is divided into first signal light and second signal light. The first signal light is input into a first DFB laser having a first output saturation characteristic. The second signal light is input into a second DFB laser having a second output saturation characteristic different from the first output saturation characteristic. First waveform-shaped light output from the first DFB laser according to the first output saturation characteristic and second waveform-shaped light output from the second DFB laser according to the second output saturation characteristic are combined.

Preferably, a phase shift is imparted to the first or second waveform-shaped light so that output signal light as a difference signal between the first waveform-shaped light and the second waveform-shaped light is obtained. This phase shift is set so that the difference between a phase shift generated in the first waveform-shaped light and a phase shift generated in the second waveform-shaped light becomes π (or an odd multiple of π). According to the second aspect of the present invention, a more rigid discrimination characteristic in relation to the output signal light can be obtained.

In accordance with a third aspect of the present invention, there is provided a device comprising a DFB laser having a stop band defined as the range of wavelengths allowing laser oscillation, and a drive circuit for supplying a drive current to the DFB laser so that the DFB laser oscillates at a first wavelength included in the stop band. Signal light having a second wavelength not included in the stop band is input into the DFB laser.

According to the third aspect of the present invention, it is possible to provide a device suitable for use in carrying out the method according to the present invention.

In accordance with a fourth aspect of the present invention, there is provided a device comprising first and second optical couplers and first and second DFB lasers. The first optical coupler divides signal light into first signal light and second signal light. The first signal light and the second signal light are input into the first and second DFB lasers, respectively. The first and second DFB lasers have first and second output saturation characteristics, respectively, wherein the first and second output saturation characteristics are different from each other. The second optical coupler combines first waveform-shaped light output from the first DFB laser according to the first output saturation characteristic and second waveform-shaped light output from the second DFB laser according to the second output saturation characteristic.

In accordance with a fifth aspect of the present invention, there is provided a device comprising an optical branch, a waveform shaper, a clock regenerator, and an optical retiming section. The optical branch divides signal light into first signal light and second signal light. The waveform shaper receives the first signal light and performs waveform shaping of the first signal light received to output resultant waveform-shaped light. The clock regenerator receives the second signal light and regenerates clock pulses according to the second signal light received. The optical retiming section receives the waveform-shaped light and the clock pulses and corrects the timing of the waveform-shaped light according to the clock pulses to output resultant regenerated signal light. The waveform shaper may be provided by the device according to the third or fourth aspect of the present invention.

The clock regenerator comprises a mode-locked laser (MLL) into which the second signal light is introduced, for example. In this case, the clock pulses may be regenerated by mode locking of the MLL according to the second signal light.

The waveform shaper comprises a nonlinear optical loop mirror, for example.

In accordance with a sixth aspect of the present invention, there is provided a system comprising an optical fiber transmission line for transmitting signal light, and at least one optical repeater arranged along the optical fiber transmission line. Each of the at least one optical repeater may be provided by the device according to the third, fourth, or fifth aspect of the present invention.

In accordance with a seventh aspect of the present invention, there is provided a system comprising an optical fiber transmission line for transmitting signal light, and an optical receiver connected to an output end of the optical fiber transmission line. The optical receiver may include the device according to the third, fourth, or fifth aspect of the present invention.

In accordance with an eighth aspect of the present invention, there is provided a device comprising a plurality of DFB lasers cascaded so that signal light is passed therethrough. Each DFB laser has a stop band defined as the range of wavelengths allowing laser oscillation. Each DFB laser is driven so as to oscillate at a first wavelength included in the stop band. The signal light has a second wavelength not included in the stop band.

According to the present invention, there is provided a method including the step of providing a DFB laser having an output saturation characteristic. Signal light is input into the DFB laser. As a result, the signal light undergoes waveform shaping according to the output saturation characteristic to obtain waveform-shaped light, which is output from the DFB laser.

According to the present invention, there is provided a method including the step of providing a DFB laser oscillating at a first wavelength. Signal light having a second wavelength different from the first wavelength is input into the DFB laser. The power of the signal light is adjusted so that the signal light undergoes waveform shaping in the DFB laser.

According to the present invention, there is provided a device comprising a DFB laser and a drive circuit for supplying a drive current to the DFB laser so that the DFB laser oscillates at a first wavelength. Signal light having a second wavelength different from the first wavelength is input into the DFB laser. The power of the signal light is adjusted so that the signal light undergoes waveform shaping in the DFB laser.

In the present invention as described above, the DFB laser oscillates in a single mode. By using this, signal light having a wavelength different from the laser oscillation wavelength of the DFB laser in its oscillating state is input into the DFB laser, thereby performing waveform shaping. However, the present invention is not limited by the use of the DFB laser, but any other lasers such as a semiconductor laser diode and a gain-clamped optical amplifier may be used. That is, optical pulses or signal light having a wavelength different from the laser oscillation wavelength of a laser in its oscillating state are/is input into the laser to thereby obtain a waveform shaping effect to the optical pulses or the signal light. For example, in a laser oscillating in multiple modes, such as a Fabry-Perot laser diode, a plurality of laser oscillation wavelengths are present, so that the signal light to be subjected to waveform shaping has a wavelength different from these laser oscillation wavelengths.

In accordance with another aspect of the present invention, there is provided an optical waveform shaping method comprising the steps of supplying a current to a laser diode so that the laser diode emits laser light, and inputting light having a wavelength different from the wavelength of the laser light emitted from the laser diode, into the laser diode to thereby perform optical waveform shaping.

In accordance with a further aspect of the present invention, there is provided an optical waveform shaping device comprising a laser diode, current supplying means for supplying a current to the laser diode so that the laser diode emits laser light, and light inputting means for inputting light having a wavelength different from the wavelength of the laser light emitted from the laser diode, into the laser diode.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 1 is a block diagram for illustrating the principle of the present invention;

DETAILED DESCRIPTION OF THE PREFERRED EMBODIMENTS

Figure 2A:
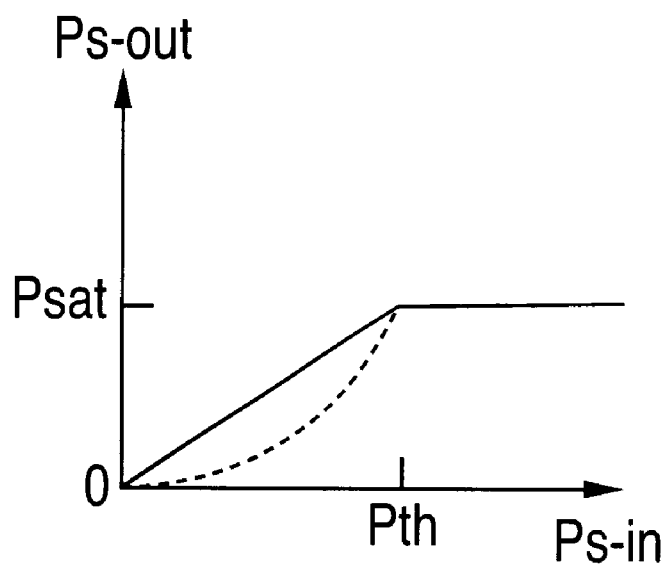
FIGS. 2A and 2B are graphs showing examples of the input-output characteristic of a DFB-LD (distributed feedback laser diode)

Some preferred embodiments of the present invention will now be described in detail with reference to the attached drawings.

The principle of the present invention will first be described with reference to FIG. 1. The method according to the present invention includes providing a DFB laser diode (DFB-LD) 2 as a distributed feedback (DFB) laser having a stop band defined as the range of wavelengths allowing laser oscillation. The width of the stop band is 0.5 to 1.0 nm, for example. The DFB-LD 2 is driven so as to oscillate at a first wavelength $\lambda_0$ included in the stop band. Oscillated laser light obtained as the result of this oscillation is output from the DFB-LD 2. In general, the oscillated laser light is continuous wave (CW) light. The DFB-LD 2 in its oscillating state has a constant clamped gain with respect to the oscillated laser light. Signal light having a second wavelength $\lambda_s$ not included in the stop band is input into the DFB-LD 2 in the oscillating state. The input signal light is subjected to waveform shaping in the DFB-LD 2, and resultant waveform-shaped light is output from the DFB-LD 2. The waveform-shaped light has the second wavelength $\lambda_a$.

The DFB-LD 2 may be driven by supplying a constant drive current (bias current) to the DFB-LD 2. However, the present invention is not limited to this method, but a DFB laser may be driven by any other methods such as optical pumping.

In the case that the DFB-LD 2 is driven by a current, which is set to a constant value, the total number of carriers contributing to laser oscillation and signal amplification is constant, and the total number of photons output from the DFB-LD 2 also becomes constant. Accordingly, by inputting external signal light given as optical pulses into the DFB-LD 2, the number of photons near the peak of each pulse becomes larger than that near the leading edge or the trailing edge, thereby exhibiting an effect that gain saturation is enhanced. By using this effect, amplitude fluctuations near the peak of each pulse of signal light having amplitude fluctuations as shown in FIG. 1 can be suppressed to thereby obtain waveform-shaped light with less amplitude fluctuations.

Thus, according to an aspect of the present invention, a DFB laser having an output saturation characteristic is used, and waveform-shaped light obtained by waveform shaping of signal light according to the output saturation characteristic is output from the DFB laser.

According to the present invention, it is also possible to suppress the accumulation of amplitude noise due to the accumulation of ASE in a transmission system using a plurality of cascaded optical amplifiers. The waveform degradation due to the accumulation of ASE is mainly due to signal/ASE beat noise, and the waveform degradation becomes most remarkable near the peak of a signal pulse. Accordingly, the application of the present invention can effectively compensate for such waveform degradation.

In general, the response of a laser in its gain clamped condition to a change in light intensity is as fast as tens of ps or less. Accordingly, the waveform shaping according to the present invention can be applied also to a short pulse having a pulse width of tens of ps or less or to an ultra high-speed signal having a speed of tens to hundreds of Gb/s. This will now be described more specifically.

In a usual semiconductor optical amplifier (SOA), the speed (modulation rate or bit rate) of input signal light is limited because of speed limitation (usually, several GHz) of absorption restoration time or carrier density variations, and waveform distortion is added to a signal having a speed equal to or greater than a limited value. To the contrary, in a gain clamped laser, excess carriers are recombined in an active layer by stimulated emission, so that the absorption restoration time can be shortened. In a sufficiently saturated condition, a high-speed response of tens of ps or less can be achieved to allow the waveform shaping also to an ultra high-speed signal as mentioned above.

Thus, according to the present invention, the waveform shaping of signal light can be performed without the dependence on the bit rate and pulse shape of the signal light.

Figure 2B:
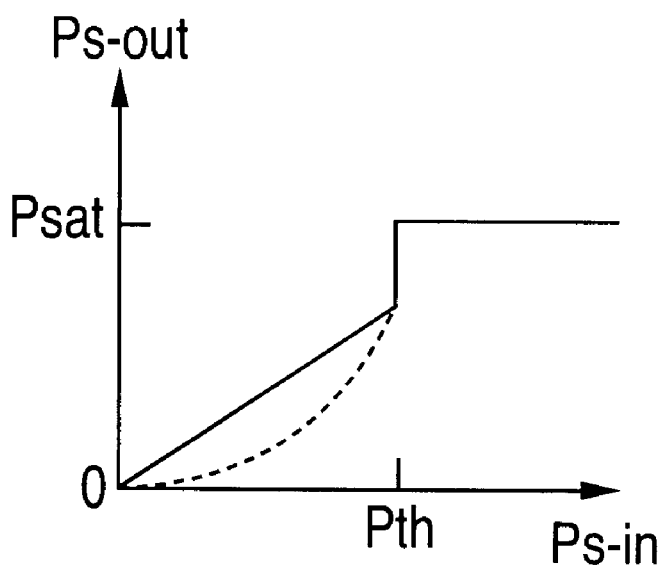

FIGS. 2A and 2B are graphs showing examples of the input-output characteristic of a DFB-LD. More specifically, the solid line in each of FIGS. 2A and 2B shows an example of the relation between input power $P_{s-in}$ of signal light and output power $P_{o-out}$ of waveform-shaped light in the DFB-LD 2 shown in FIG. 1. The characteristic shown by the broken line in each of FIGS. 2A and 2B will be hereinafter described.

The characteristic shown by the solid line in FIG. 2A is such that when the input power $P_{o-in}$ is equal to or less than a threshold $P_{th}$, the output power $P_{s-out}$ increases in proportion to the input power $P_{s-in}$, whereas when the input power $P_{a-in}$ is greater than the threshold $P_{th}$, the output power $P_{a-out}$ becomes a constant saturated output power $P_{aat}$. The reason for the constant saturated output power $P_{aat}$ is that when the input power $P_{s-in}$ reaches the threshold $P_{th}$, the laser oscillation is stopped, and the gain is saturated for a higher input power, resulting in a constant output power. Accordingly, in the case that the signal light is provided by optical pulses each having a high level and a low level, the amplitude fluctuations at the high level of the signal light can be effectively suppressed in the DFB-LD 2 by setting the low level to a zero level and setting the high level to a value larger than the threshold $P_{th}$.

Thus, according to an aspect of the present invention, the power of signal light is adjusted so that the amplitude fluctuations at the high level of the signal light are suppressed in the DFB-LD 2. However, the present invention is not limited to this method, but the high level of the signal light may be set to a value smaller than the threshold $P_{th}$. The reason for this setting is that there is a case that the output power tends to be saturated for an input power smaller than the threshold, depending upon the dynamic characteristics or the like of a DFB laser.

As shown in FIG. 2B, there is a case that when the input power $P_{s-in}$ reaches the threshold $P_{th}$ to stop the laser oscillation, the gain of signal light rapidly increases. Since the threshold $P_{th}$ is substantially equal to the power of oscillated laser light, the gain increases by about 3 dB, for example. In this case, the input-output characteristic in the range of input powers larger than the threshold $P_{th}$ becomes closer to that of a so-called digital discriminator, thereby effectively suppressing the amplitude fluctuations at the high level.

Figure 3:
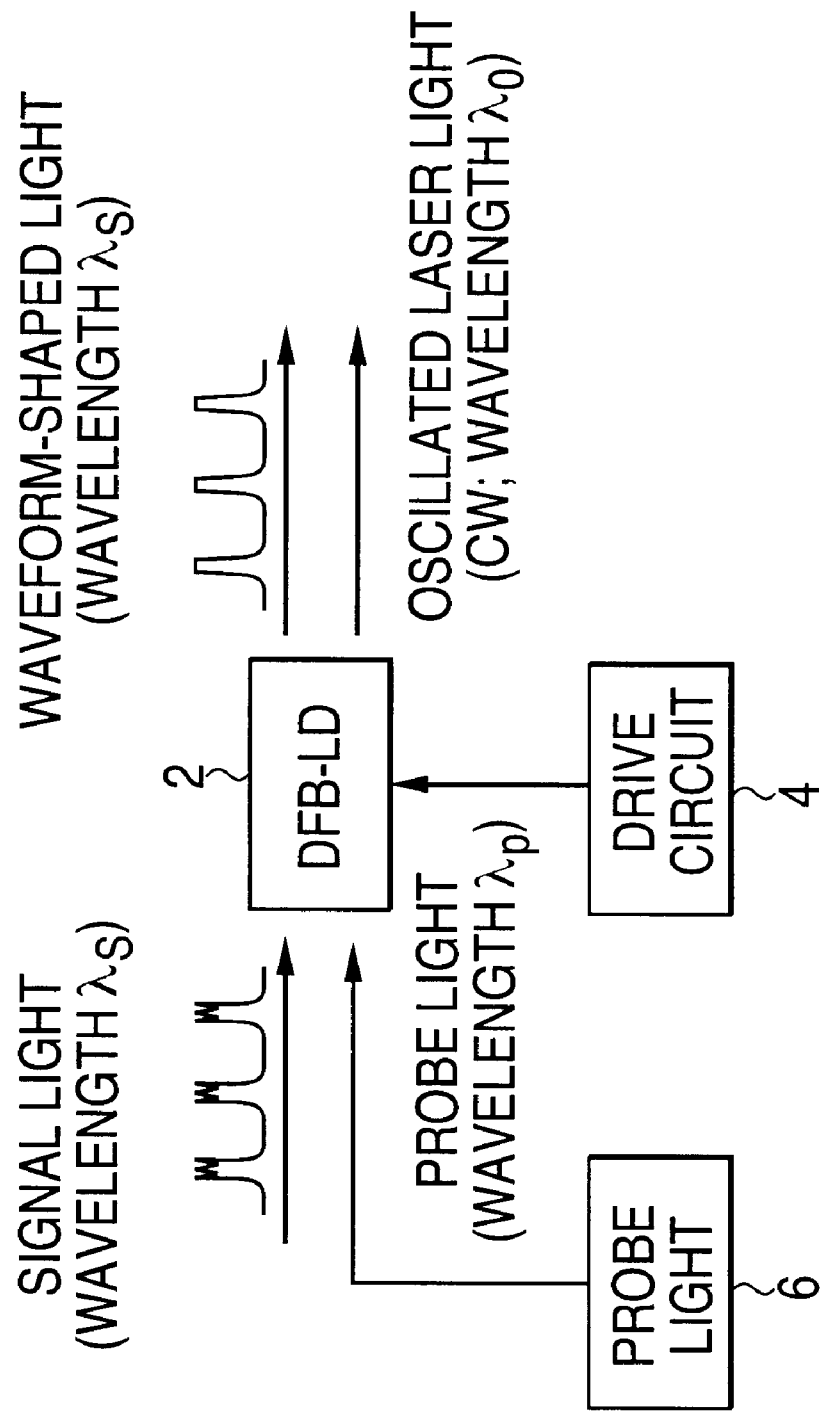
FIG. 3 is a block diagram showing a first preferred embodiment of the waveform shaper according to the present invention.

FIG. 3 is a block diagram showing a first preferred embodiment of the waveform shaper according to the present invention. This waveform shaper includes a DFB-LD 2 that can provide an output saturation characteristic according to the present invention, and a drive circuit 4 for supplying a constant or controlled drive current (bias current) to the DFB-LD 2 so that the DFB-LD 2 oscillates at a wavelength $\lambda_0$. Signal light having a wavelength $\lambda_s$ whose power is adjusted to an optimum value in accordance with the above-mentioned principle is supplied to the DFB-LD 2, and the signal light is subjected to waveform shaping according to the output saturation characteristic in the DFB-LD 2 to obtain waveform-shaped light having the wavelength $\lambda_s$. The waveform-shaped light thus obtained is output from the DFB-LD 2.

To supply the signal light to the DFB-LD 2, an optical fiber for transmitting the signal light and a lens for optically coupling an output end of the optical fiber and a first end of the DFB-LD 2 may be used. Further, to effectively use the waveform-shaped light output from the DFB-LD 2, an optical fiber to which the waveform-shaped light is to be introduced and a lens for optically coupling an input end of the optical fiber and a second end of the DFB-LD 2 may be used. Each lens may be formed integrally with the corresponding optical fiber by heating the end of the corresponding optical fiber.

The stop band of the DFB-LD 2 is defined as the range of wavelengths allowing laser oscillation, so that the wavelength $\lambda_0$ of the oscillated laser light is included in the stop band. The wavelength $\lambda_s$ of the signal light is limited only by the fact that it is not included in the stop band. For example, in the case that the laser oscillation wavelength $\lambda_0$ of the DFB-LD 2 is 1550.0 nm and the stop band is the range of 1549.5 to 1550.5 nm, the wavelength $\lambda_a$ of the signal light is set to $\lambda_a$<1549.5 nm or $\lambda_a$>1550.5 nm.

The waveform shaper shown in FIG. 3 is characterized in that it further includes a probe light source 6 for inputting probe light (control light) into the DFB-LD 2. The probe light has a third wavelength $\lambda_{hd p}$ not included in the stop band of the DFB-LD 2. The wavelength $\lambda_p$ is not limited by whether or not it coincides with the wavelength $\lambda_a$ of the signal light. However, in consideration of signal processing to be performed in the subsequent stage, the wavelength $\lambda_p$ is preferably different from the wavelength $\lambda_s$.

As shown in FIG. 3, the probe light is input to the first end of the DFB-LD 2 so as to propagate in the same direction as the direction of propagation of the signal light in the DFB-LD 2. Alternatively, the probe light may be input to the second end of the DFB-LD 2 so as to propagate in a direction opposite to the direction of propagation of the signal light in the DFB-LD 2. To input the probe light into the DFB-LD 2 along the same optical path as that of the signal light, an optical coupler using a half-mirror or a fiber fusion type optical coupler or WDM (wavelength division multiplex) coupler may be used.

By using the probe light source 6, an excess increase in noise at the low level of the signal light can be suppressed. Further, in the case that the low level of the signal light continues, undesirable laser oscillation can be prevented to stabilize the operation of the waveform shaper. If the probe light source 6 is not used, there is a case that ASE-ASE beat noise accumulated at the low level of the signal light and perturbation of the low level due to transmitted waveform degradation cannot be effectively suppressed. Further, the oscillating state and unoscillating state of the DFB-LD 2 are repeated with changes of the high level and low level of the signal light, causing possible instability of the operation of the waveform shaper in this preferred embodiment, the probe light has a constant power. Accordingly, the probe light having a constant power is supplied to the DFB-LD 2 also at the low level of the signal light, thus obtaining the above-mentioned technical effects. The power of the probe light is adjusted so as to suppress an increase in noise at the low level of the signal light.

Figure 4:
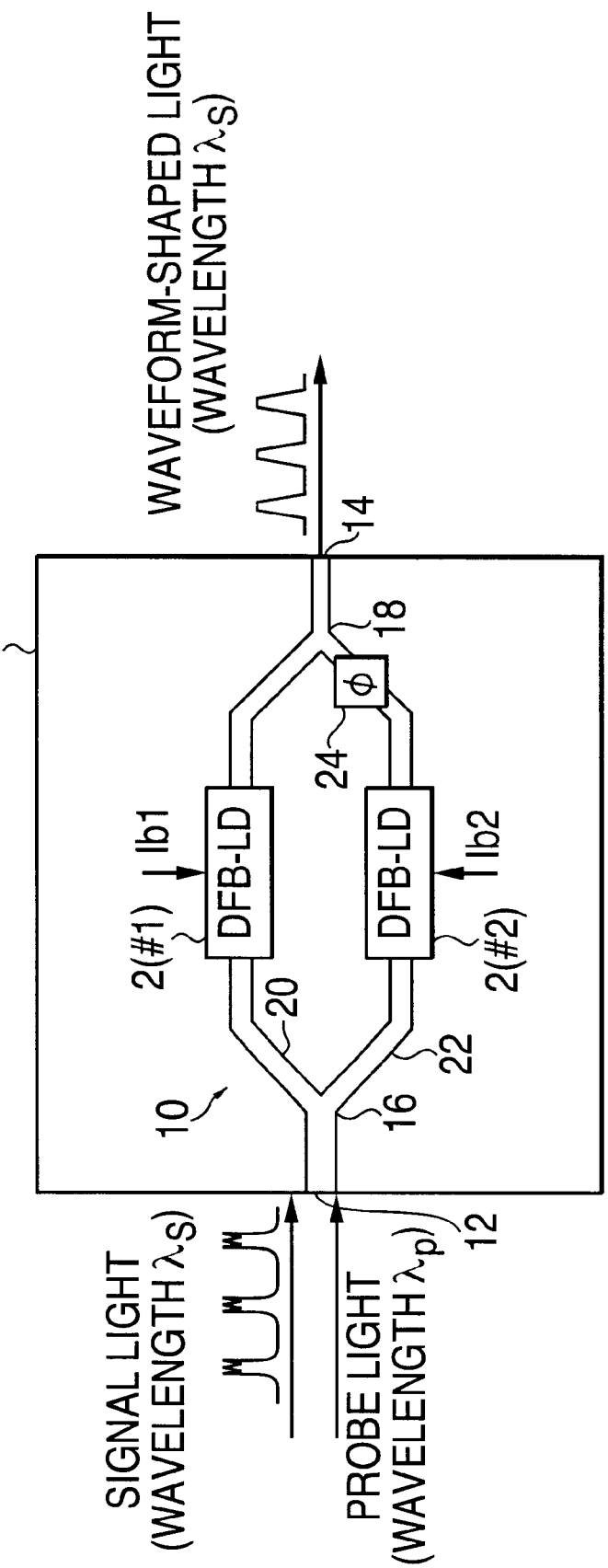
FIG. 4 is a block diagram showing a second preferred embodiment of the waveform shaper according to the present invention.

FIG. 4 is a block diagram showing a second preferred embodiment of the waveform shaper according to the present invention. This waveform shaper has a Mach-Zehnder interferometer 10 formed on a waveguide substrate 8. The Mach-Zehnder interferometer 10 has an input port 12 to which signal light or signal light and probe light is/are to be input, an output port 14 from which waveform-shaped light is to be output, Y-branches 16 and 18 optically connected to the input port 12 and the output port 14, respectively, and optical paths 20 and 22 for optically connecting the Y-branches 16 and 18.

A first DFB-LD 2(#1) is provided on the optical path 20, and a second DFB-LD 2(#2) and a phase shifter 24 are provided on the optical path 22 so as to be arranged in this order in a direction from the input port 12 toward the output port 14. The DFB-LDs 2(#1) and 2(#2) are supplied with drive currents (bias currents) $I_{b1}$ and $I_{b2}$ from drive circuits (not shown), respectively, and each DFB-LD accordingly has an output saturation characteristic according to the present invention. More specifically, the drive currents $I_{b1}$ and $I_{b2}$ are set to different values, for example, so that the DFB-LD 2(#1) has a first output saturation characteristic and the DFB-LD 2(#2) has a second output saturation characteristic different from the first output saturation characteristic.

The signal light supplied to the input port 12 is divided into first signal light and second signal light at the Y-branch 16. In general, the power of the first signal light is substantially equal to the power of the second signal light. The first signal light is supplied through the optical path 20 to the DFB-LD 2(#1). In the DFB-LD 2(#1), the first signal light is subjected to waveform shaping according to the first output saturation characteristic to obtain first waveform-shaped light, which is in turn output from the DFB-LD 2(#1). On the other hand, the second signal light is supplied through the optical path 22 to the DFB-LD 2(#2). In the DFB-LD 2(#2), the second signal light is subjected to waveform shaping according to the second output saturation characteristic to obtain second waveform-shaped light, which is in turn output from the DFB-LD 2(#2). The first waveform-shaped light and the second waveform-shaped light are combined at the Y-branch 18 to obtain waveform-shaped light (output signal light), which is in turn output from the output port 14.

The phase shifter 24 imparts a phase shift ø to the second waveform-shaped light so that the waveform-shaped light to be output from the output port 14 becomes a difference signal between the first waveform-shaped light and the second waveform-shaped light. As far as such a difference signal can be obtained, the phase shifter 24 may be omitted, or it may be provided on the optical path 20 at a position between the DFB-LD 2(#1) and the Y-branch 18. For example, the phase shifter 24 may be omitted by setting the optical path lengths of the optical paths 20 and 22 to suitable values. The need for such a phase shift to the first waveform-shaped light or the second waveform-shaped light is partially due to the fact that a phase shift imparted to the first signal light in the DFB-LD 2(#1) and a phase shift imparted to the second signal light in the DFB-LD 2(#2) are different according to a difference in driving conditions between the DFB-LDs 2(#1) and 2(#2).

Figure 5A:
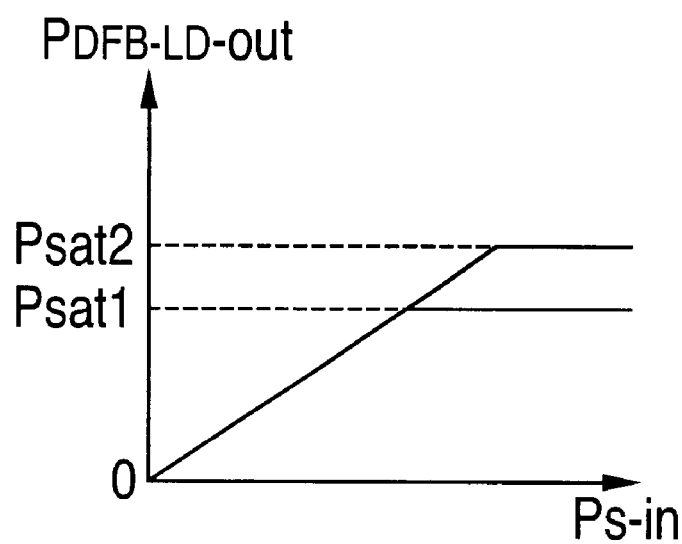
FIG. 5A is a graph showing the input-output characteristic of each DFB-LD shown in FIG. 4.
Figure 5B:
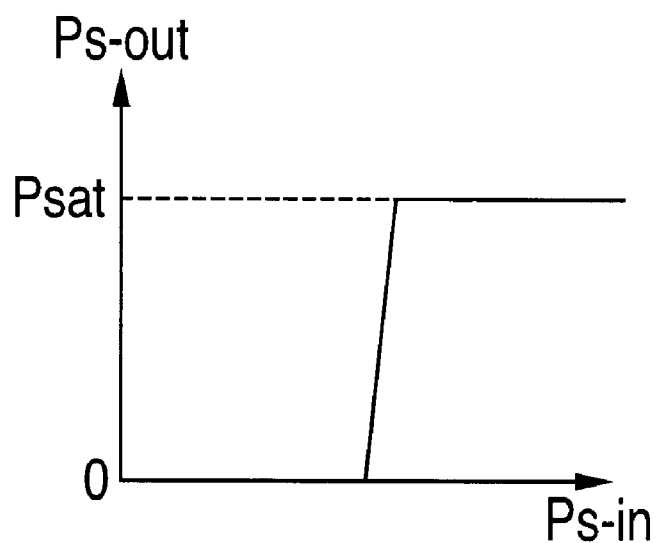
FIG. 5B is a graph showing the input-output characteristic of the waveform shaper shown in FIG. 4.

FIG. 5A is a graph showing the input-output characteristic of each DFB-LD shown in FIG. 4, and FIG. 5B is a graph showing the input-output characteristic of the waveform shaper shown in FIG. 4. In FIG. 5A, the horizontal axis represents the input power $P_{a-in}$ of the waveform shaper or the input power of each DFB-LD, and the vertical axis represents the output power $P_{DFB-LD-out}$ of each DFB-LD. In FIG. 5B, the horizontal axis represents the input power $P_{s-in}$ of the waveform shaper, and the vertical axis represents the output power $P_{a-out}$ of the waveform shaper.

As shown in FIG. 5A, the first output saturation characteristic of the DFB-LD 2(#1) is given by a saturated output power $P_{ast1}$, and the second output saturation characteristic of the DFB-LD 2(#2) is given by a saturated output power $P_{ast2}$ ($\neq P_{ast1}$) In this example shown in FIG. 5A, $P_{ast1} < P_{ast2}$ is obtained by suitably setting the drive currents for the DFB-LDs 2(#1) and 2(#2). A partial characteristic until reaching the saturated output power $P_{ast1}$ (a characteristic in a proportional region) in the first output saturation characteristic is substantially coincident with that in the second output saturation characteristic. Accordingly, the output signal light given as the difference signal between the first waveform-shaped light and the second waveform-shaped light (i.e., the waveform-shaped light output from the waveform shaper shown in FIG. 4) is determined by a rigid discrimination characteristic as shown in FIG. 5B.

Thus, according to the second preferred embodiment of the waveform shaper shown in FIG. 4, the output saturation characteristic becomes a discrimination characteristic as shown in FIG. 5B, thereby allowing better waveform shaping. Further, since the difference signal between the first waveform-shaped light and the second waveform-shaped light is obtained, an increase in noise can be effectively prevented also in the case of using no probe light.

Figure 6:
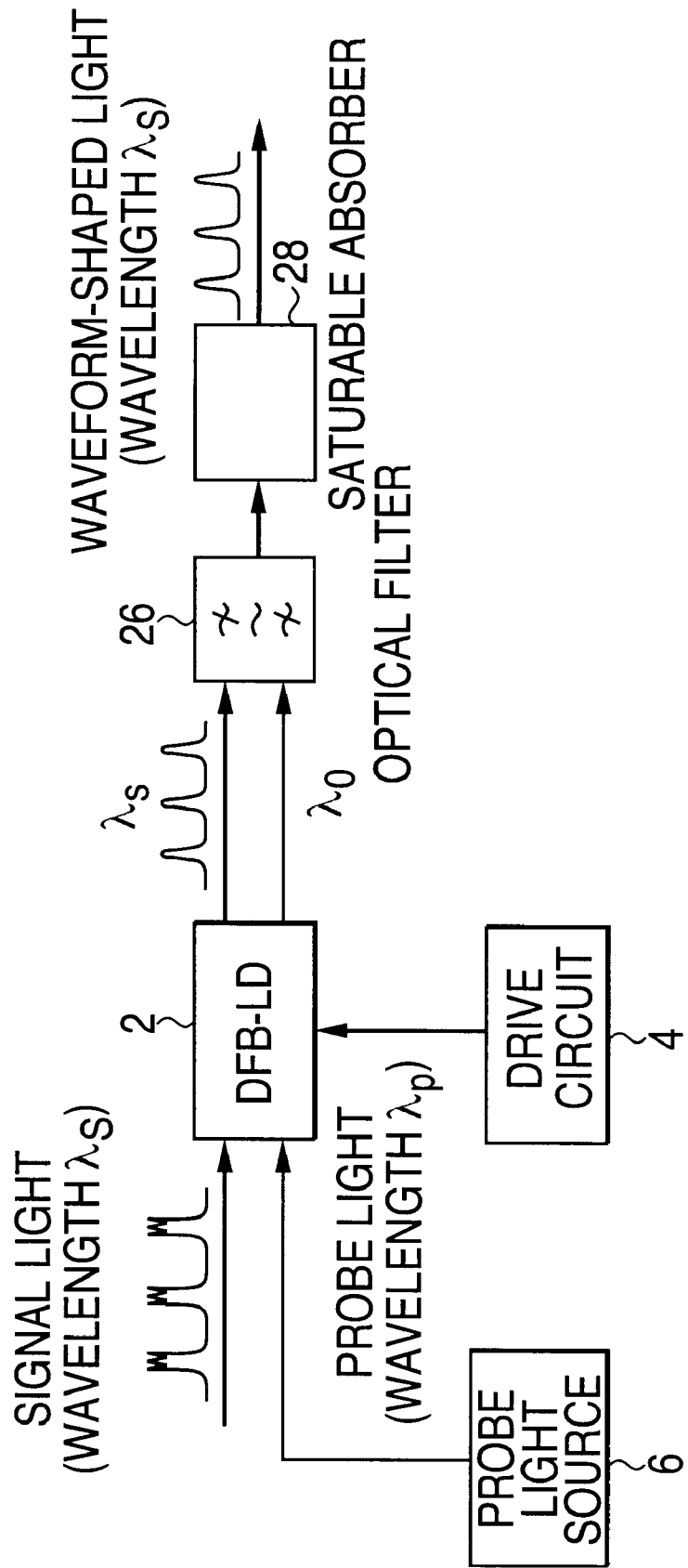
FIG. 6 is a block diagram showing a third preferred embodiment of the waveform shaper according to the present invention.

FIG. 6 is a block diagram showing a third preferred embodiment of the waveform shaper according to the present invention. In contrast to the first preferred embodiment shown in FIG. 3, the third preferred embodiment is characterized in that an optical filter 26 optically connected to the output of the DFB-LD 2 and a saturable absorber 28 optically connected to at least one of the input and the output of the DFB-LD 2 are additionally provided. While the saturable absorber 28 is optically connected through the optical filter 26 to the output of the DFB-LD 2 as shown, a saturable absorber optically connected to the input of the DFB-LD 2 may be used.

The optical filter 26 has a passband including the wavelength $\lambda_s$ of signal light and not including the wavelength $\lambda_0$ of oscillated laser light in the DFB-LD 2 and the wavelength $\lambda_p$ of probe light. By adopting the optical filter 26, the oscillated laser light and the probe light both unnecessary and rather harmful in the subsequent signal processing can be removed, so that it is possible to provide a waveform shaper highly valuable for use in an all-optical regenerative repeater or the like. In the case that the probe light source 6 is not adopted, the optical filter 26 has a passband including the wavelength $\lambda_a$ of signal light and not including the wavelength $\lambda_0$ of oscillated laser light in the DFB-LD 2.

The saturable absorber 28 is provided by a reverse-biased semiconductor device (e.g., laser diode and semiconductor optical amplifier) to suppress noise due to amplitude fluctuations at the low level of signal light according to its saturable absorption characteristic. In general, a saturable absorber exhibits a nonlinear input-output characteristic by an absorption effect to input light having a level equal to or less than a saturation level. Accordingly, when the light corresponding to the signal light output from the DFB-LD 2 and passed through the optical filter 26 is passed through the saturable absorber 28, the input-output characteristic of this waveform shaper has a partial characteristic shown by the broken line in FIG. 2A or FIG. 2B, thus obtaining an operation closer to that of a discriminating circuit. As a result, amplitude fluctuations at the high level and the low level of the signal light can be suppressed to allow higher-quality waveform shaping.

To further improve the response of the saturable absorber 28, a light source for inputting other probe light into the saturable absorber 28 may be additionally provided. Further, to stabilize the operation of the saturable absorber 28, an optical isolator may be optically connected to the input or output of the saturable absorber 28.

In this preferred embodiment, the Y-branches 16 and 18 each operating as an optical coupler are provided by the Mach-Zehnder interferometer 10 formed on the waveguide substrate 8, so that the waveform shaper can be made compact.

Figure 7:
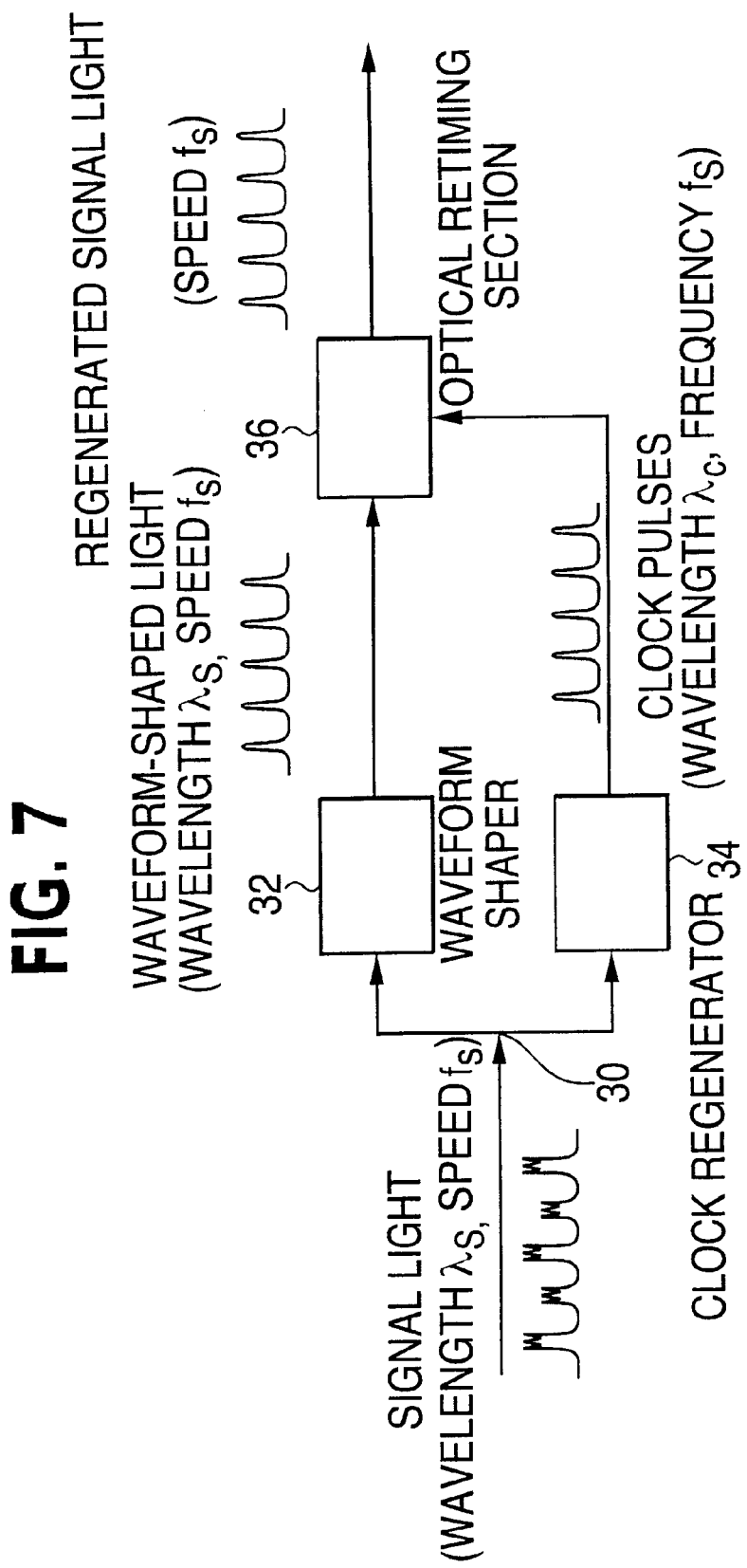
FIG. 7 is a block diagram showing a preferred embodiment of the all-optical signal regenerating device according to the present invention.

FIG. 7 is a block diagram showing a preferred embodiment of the all-optical signal regenerating device according to the present invention. This device includes an optical branch 30 provided by an optical coupler, for example, a waveform shaper 32 provided by any one of the various preferred embodiments of the present invention, a clock regenerator 34, and an optical retiming section 36. The optical branch 30 divides supplied signal light into first signal light and second signal light. The first signal light is supplied to the waveform shaper 32. The waveform shaper 32 performs waveform shaping of the supplied signal light to output resultant waveform-shaped light. The second signal light is supplied to the clock regenerator 34. The clock regenerator 34 regenerates clock pulses (optical clock) according to the supplied second signal light. The waveform-shaped light and the clock pulses are supplied to the optical retiming section 36. The optical retiming section 36 corrects the timing of the waveform-shaped light according to the clock pulses to output resultant regenerated signal light.

In obtaining the waveform-shaped light to be output from the waveform shaper 32, the waveform shaping is performed on the high level and/or the low level of the signal light according to the present invention. However, the pulse spacing of the wavelength-shaped light possibly becomes nonuniform. To the contrary, the pulse spacing of the clock pulses output from the clock regenerator 34 is uniform. Accordingly, by configuring the optical retiming section 36 so that it functions as an optical AND circuit, for example, it is possible to obtain regenerated signal light subjected to waveform shaping and having a uniform pulse spacing.

The clock regenerator 34 may include a MLL into which the second signal light is introduced. In this case, the clock pulses are regenerated by mode locking of the MLL according to the second signal light. This will now be described more specifically for a ring MLL.

Figure 8:
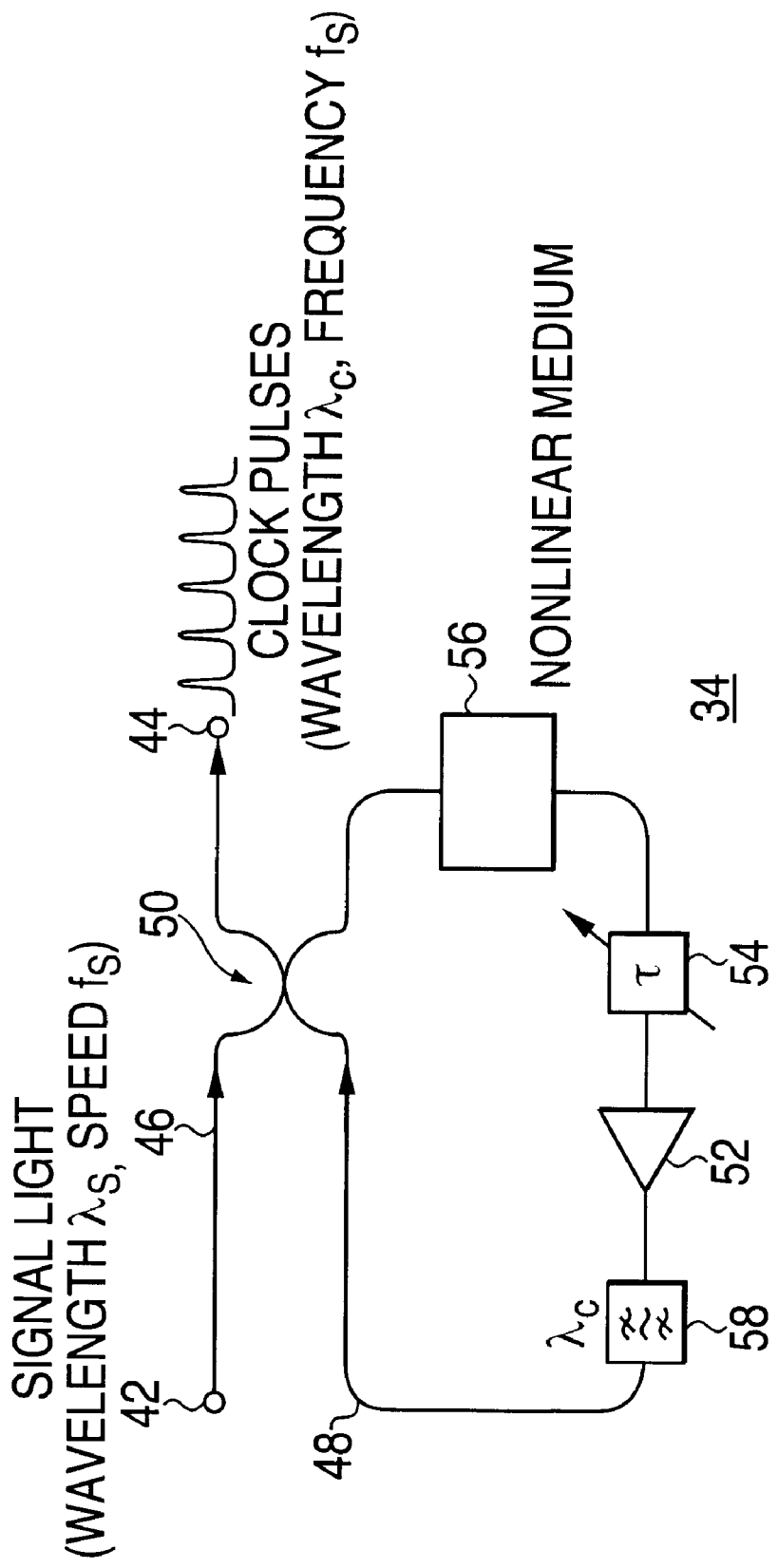
FIG. 8 is a block diagram showing a preferred embodiment of the clock regenerator shown in FIG. 7.

FIG. 8 is a block diagram showing a preferred embodiment of the clock regenerator 34 shown in FIG. 7. This clock regenerator 34 includes an optical path 46 provided between an input port 42 and an output port 44, and an optical loop 48 as a ring laser optically coupled to the optical path 46. Each of the optical path 46 and the optical loop 48 is provided by an optical fiber, for example. In this case, the optical coupling between the optical path 46 and the optical loop 48 may be made by a fiber fusion type optical coupler 50. Accordingly, a part of the optical path 46 and a part of the optical loop 48 are provided by the optical coupler 50.

The optical loop 48 includes an optical amplifier 52 for compensating for a loss in the optical loop 48 so that laser oscillation occurs in the optical loop 48, an adjuster 54 configured by a delay circuit having a variable delay time τ, and a nonlinear medium (nonlinear optical medium) 56. Particularly in this preferred embodiment, the optical loop 48 further includes an optical bandpass filter 58 having a passband including a wavelength $\lambda_c$ of the laser oscillation by the ring laser.

Signal light having a wavelength $\lambda_a$ (the second signal light) modulated at a speed (or bit rate) $f_s$ is supplied to the input port 42, and a part of the supplied signal light is introduced through the optical coupler 50 into the optical loop 48. The optical path length L of the optical loop 48 is preliminarily adjusted by the adjuster 54 so that the modulation rate (corresponding to frequency) $f_s$ of the signal light becomes equal to an integral multiple of the reciprocal $\Delta\nu = c/L$ (c: light velocity) of a recirculation period of the optical loop 48. The optical amplifier 52 may be provided by an EDFA (erbium doped fiber amplifier), for example.

Particularly in this preferred embodiment, the nonlinear medium 56 is provided by a third-order nonlinear medium. When the signal light is introduced into the nonlinear medium 56, amplitude modulation (AM) or frequency modulation (FM) occurs in the nonlinear medium 56 to mode-lock the laser oscillation by the optical loop 48. As a result, clock pulses having a wavelength $\lambda_c$ and a frequency $f_s$ are generated or regenerated, and the clock pulses are output through the optical coupler 50 from the output port 44. This will now be described more specifically.

Continuous wave (CW) laser light having a wavelength $\lambda_c$ is preliminarily oscillated by a ring laser configured by the optical loop 48, and signal light having a wavelength $\lambda_s$ and a frequency (bit rate or speed) $f_a$ is input into the optical loop 48. At this time, four-wave mixing (FWM) employing this signal light as pump light (excitation light) is generated in the nonlinear medium 56, so that the CW light having the wavelength $\lambda_c$ is amplitude-modulated by the signal light. The amplitude-modulated CW light includes a component of the fundamental frequency $f_a$. Accordingly, by setting the optical path length of the optical loop 48 as mentioned above, clock pulses having a frequency $f_a$ are generated.

Thus, clock pulses can be obtained without the need for opto/electric conversion in this preferred embodiment, so that it is possible to provide an all-optical clock regenerator not depending on the bit rate, pulse shape, etc. of signal light.

The nonlinear medium 56 may be provided by a semiconductor optical amplifier (SOA), a single-mode fiber, or a dispersion shifted fiber (DSF). It is effective to use a high-nonlinear DSF (HNL-DSF) having high nonlinear effects as the DSF. The HNL-DSF will be hereinafter described. In the case of using an SOA as the nonlinear medium 56, gain is generated in the nonlinear medium 56. Accordingly, the optical amplifier 52 for maintaining the laser oscillation in the optical loop 48 may be eliminated. More generally, in the case that the linear or nonlinear gain in the nonlinear medium 56 is sufficiently large, the optical amplifier 52 may be eliminated.

In the case that an HNL-DSF is used as the nonlinear medium 56, the wavelength $\lambda_a$ of signal light is preferably set substantially equal to the zero-dispersion wavelength $\lambda_0$ of the HNL-DSF, so as to most effectively generate FWM in the nonlinear medium 56. With this setting, optimum phase matching can be attained, and a broadest conversion band and a maximum conversion efficiency can be obtained. The term of "conversion" used herein means conversion from signal light to clock pulses. Further, by managing the zero-dispersion wavelength $\lambda_0$ of the HNL-DSF to a constant value with high accuracy, the conversion band can be broadened. This will also be hereinafter described.

Figure 9:
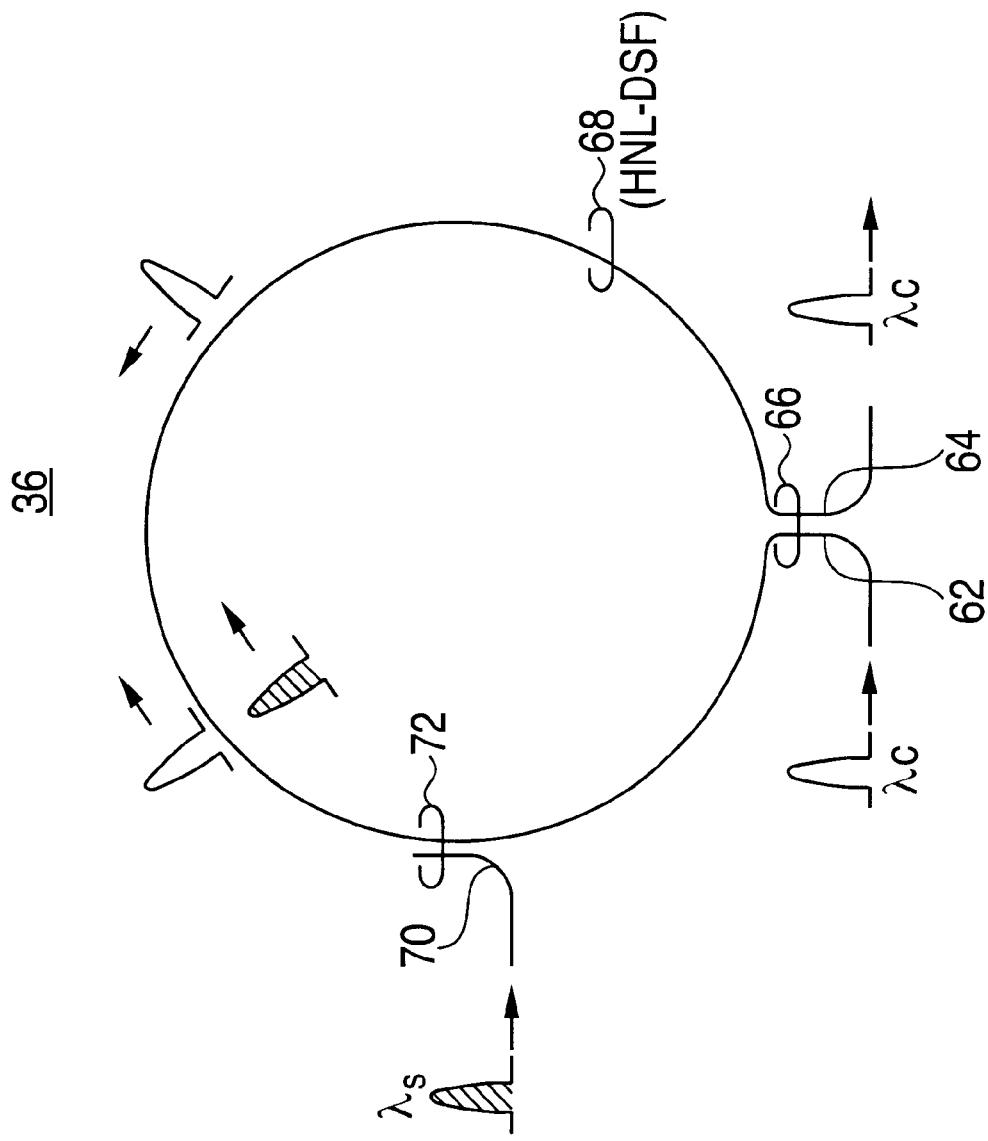
FIG. 9 is a diagram showing a preferred embodiment of the optical retiming section shown in FIG. 7.

FIG. 9 is a diagram showing a preferred embodiment of the optical retiming section 36 shown in FIG. 7. In this preferred embodiment, the optical retiming section 36 is provided by a nonlinear optical loop mirror (NOLM). The NOLM includes a first optical coupler 66 including a first optical path 62 and a second optical path 64 directionally coupled to each other, a loop optical path 68 for connecting the optical paths 62 and 64, and a second optical coupler 72 including a third optical path 70 directionally coupled to the loop optical path 68. A part or the whole of the loop optical path 68 is provided by a nonlinear optical medium. Particularly in this preferred embodiment, an HNL-DSF is used as the nonlinear optical medium. The coupling ratio of the first optical coupler 66 is set to 1:1.

The waveform-shaped light from the waveform shaper 32 (see FIG. 7) is supplied as control pulses having a wavelength $\lambda_o$ to the third optical path 70. The clock pulses from the clock regenerator 34 (see FIG. 7) are supplied as probe pulses having a wavelength $\lambda_c$ to the first optical path 62.

The operation of this NOLM will now be described in brief. When the probe pulses and the control pulses are input into the optical paths 62 and 70, respectively, regenerated pulses (regenerated signal light) are obtained in accordance with the operation of an optical AND circuit, and they are output from the second optical path 64 of the optical coupler 66. The regenerated pulses have the same wavelength $\lambda_o$ as that of the probe pulses.

The probe pulses are split into two components having equal powers by the optical coupler 66. These two components propagate clockwise and counterclockwise in the loop optical path 68, respectively. During the propagation in the loop optical path 68, the two components undergo equal phase shifts Φ by the nonlinear optical medium, and thereafter they are combined by the optical coupler 66. This phenomenon occurs in the case that the control pulses are not input into the optical path 70. In this case, the light obtained by the combination of the two components at the optical coupler 66 is output from the first optical path 62 as if it is reflected by a mirror, but not output from the second optical path 64, because the two components are equal in power and phase.

When the control pulses are introduced into the loop optical path 68 by the optical coupler 72, the control pulses propagate in only one direction (e.g., clockwise as shown) in the loop optical path 68, and the nonlinear refractive index of the nonlinear optical medium changes for the light propagating in this direction only when the control pulses are at the high level. Accordingly, in combining the two components of the probe pulses at the optical coupler 66, the phases of the two components of the probe pulses synchronous with the high level of the control pulses are different from each other, and the phases of the two components of the probe pulses synchronous with the low level of the control pulses are coincident with each other. Letting Δ Φ denote a phase difference in the former case, an output proportional to $\{1-\cos(\Delta\Phi)\}/2$ is obtained from the second optical path 64 of the optical coupler 66. Accordingly, by adjusting the power of the control pulses (i.e., the waveform-shaped light from the waveform shaper 32) so that the phase difference ΔΦ becomes π, it is possible to carry out an operation such that the light having a wavelength $\lambda_c$ is output from the second optical path 64 only when the control pulses and the probe pulses overlap each other, and otherwise the output level becomes a low level.

Thus, the regenerated signal light synchronous with the clock pulses can be obtained according to the waveform-shaped light supplied to the optical retiming section 36 (see FIG. 7). Accordingly, the conversion from the waveform-shaped light into the regenerated signal light accompanies the wavelength conversion from $\lambda_s$ into $\lambda_c$. Accordingly, the all-optical signal regenerating device shown in FIG. 7 can be used also as a wavelength converter used at a node in an optical network, for example. In this case, it is possible to obtain a converted wavelength corresponding to the wavelength $\lambda_c$ of the clock pulses regenerated in the clock regenerator 34 (see FIG. 7).

The NOLM itself has a saturable absorption characteristic and accordingly also has a waveform shaping function. That is, waveform distortion near the leading edge (low-power region) and the peak (high-power region) of a pulse can be compressed by the nonlinear (saturation) effects at these regions, so that the NOLM itself can perform an operation of waveform shaping similar to that in each preferred embodiment of the waveform shaper mentioned above.

Further, a four-wave mixer may also be used as the optical retiming section 36 having the function of an optical AND circuit (see FIG. 7). In this case, the waveform-shaped light or the clock pulses is/are used as pump light, and four-wave mixing is generated according to the ON/OFF state of the pump light, thereby performing the optical retiming. In the case that an optical fiber is used as a nonlinear optical medium for the four-wave mixer, it is effective to make the zero-dispersion wavelength of this optical fiber coincident with the wavelength of the pump light in optimizing a phase matching condition.

As a nonlinear optical effect applicable to optical signal processing in an optical communication system, it is considered to apply three-wave mixing in a second-order nonlinear optical medium or an optical Kerr effect such as self-phase modulation (SPM), cross-phase modulation (XPM), and four-wave mixing (FWM) in a third-order nonlinear optical medium. Examples of the second-order nonlinear optical medium include InGaAs and $LiNbO_3$. Examples of the third-order nonlinear optical medium include an optical fiber and a semiconductor medium such as a semiconductor optical amplifier (SOA) and a distributed feedback laser diode (DFB-LD).

In the preferred embodiment of the clock regenerator 34 shown in FIG. 8 or the preferred embodiment of the optical retiming section 36 shown in FIG. 9, the optical Kerr effect in an optical fiber is particularly effective. A single-mode fiber is suitable as the optical fiber, and especially a dispersion-shifted fiber (DSF) having a relatively small chromatic dispersion is preferable.

In general, the third-order nonlinear coefficient γ of an optical fiber is expressed as follows:

$$\gamma = \omega n_2 / c A_{\mathit{eff}} \tag{1}$$

where ω is the optical angular frequency, c is the velocity of light in a vacuum, and $n_2$ and $A_{\mathit{eff}}$ are the nonlinear refractive index and the effective core area of the optical fiber, respectively.

The nonlinear coefficient γ of a conventional DSF is as small as about $2.6\ W^{-1}km^{-1}$, so a fiber length of several km to 10 km or more is necessary to obtain sufficient conversion efficiency. If a shorter DSF can be used to realize sufficient conversion efficiency, the zero-dispersion wavelength can be managed with high accuracy, thereby realizing high-speed and wide-band conversion. The term of "conversion" used herein means conversion from signal light into clock pulses or conversion from waveform-shaped light into regenerated signal light.

In general, for enhancement of the third-order nonlinear effect of an optical fiber, it is effective to increase a light intensity by increasing the nonlinear refractive index $n_2$ in Eq. (1) or by reducing a mode field diameter (MFD) corresponding to the effective core area $A_{\mathit{eff}}$ in Eq. (1).

The nonlinear refractive index n2 can be increased by doping the clad with fluorine or the like or by doping the core with a high concentration of $GeO_2$, for example. By doping the core with 25 to 30 mol % of $GeO_2$, a large value of $5\times10^{-20}\ m^2/W$ or more (about $3.2\times10^{-20}\ m^2/W$ for a usual silica fiber) can be obtained as the nonlinear refractive index n2.

On the other hand, the MFD can be reduced by designing a relative refractive-index difference Δ between the core and the clad or by designing the core shape. Such design of a DSF is similar to that of a dispersion compensating fiber (DCF). For example, by doping the core with 25 to 30 mol % of $GeO_2$ and setting the relative refractive-index difference Δ to 2.5 to 3.0%, a small value of less than 4 μm can be obtained as the MFD. Owing to the combined effects of increasing the nonlinear refractive index $n_2$ and reducing the MFD, an optical fiber (HNL-DSF) having a large value of 15 $W^{-1}km^{-1}$ or more as the nonlinear coefficient γ can be obtained.

As another important factor, the HNL-DSF having a large nonlinear coefficient γ as mentioned above has a zero dispersion in a wavelength band used. This point can also be satisfied by setting each parameter in the following manner. That is, in general, a dispersion in a usual DCF increases in a normal dispersion region with an increase in refractive index difference Δ under the condition that the MFD is set constant. On the other hand, the dispersion decreases with an increase in core diameter, whereas the dispersion increases with a decrease in core diameter. Accordingly, the dispersion can be reduced to zero by increasing the core diameter under the condition that the MFD is set to a certain value in a wavelength band used.

A phase shift due to the optical Kerr effect in an optical fiber having a length L is proportional to $\gamma P_p L$ where $P_P$ is the average pump light power. Accordingly, the fiber having a nonlinear coefficient $\gamma$ of 15 $W^{-1}km^{-1}$ can achieve the same conversion efficiency as that by a usual DSF even when the fiber length is reduced to about $2.6/15 \approx 1/5.7$ as compared with the usual DSF. As mentioned above, the usual DSF requires a length of about 10 km for sufficient conversion efficiency. To the contrary, the HNL-DSF having a large nonlinear coefficient $\gamma$ as mentioned above can obtain a similar effect with a reduced length of about 1 to 2 km. Practically, loss in the fiber is reduced in an amount corresponding to a decrease in fiber length, so that the fiber can be further shortened to obtain the same efficiency. In such a short fibers controllability of the zero-dispersion wavelength can be improved, and ultra wide-band conversion can be achieved as will be hereinafter described. Further, when the fiber length is several km, polarization can be fixed, that is, a polarization maintaining ability can be ensured. Therefore, application of the HNL-DSF to the present invention is greatly effective in achieving high conversion efficiency and wide conversion band and removing polarization dependence.

To effectively produce an optical Kerr effect, especially XPM in the NOLM shown in FIG. 9, for example, and thereby improve the efficiency of conversion from the waveform-shaped light into the regenerated signal light, phase matching between the probe pulses and the control pulses must be achieved. The phase matching will now be described with reference to FIG. 9. The probe pulses are branched to first probe pulses propagating clockwise in the loop optical path 68 and second probe pulses propagating counterclockwise in the loop optical path 68 by the optical coupler 66. The control pulses are passed through the optical coupler 72 and propagate clockwise in the loop optical path 68.

A phase matching condition in the loop optical path 68 is given by timing coincidence of the control pulses and the first probe pulses both propagating clockwise in the loop optical path 68. If the timing coincidence of the control pulses and the first probe pulses is not achieved, optical Kerr shift by XPM is limited to cause a difficulty of effective operation of an optical AND circuit.

Since the wavelength of the control pulses and the wavelength of the first probe pulses are different from each other, the group velocity of the control pulses and the group velocity of the first probe pulses in the loop optical path 68 are different from each other, resulting in occurrence of timing deviation proportional to the length of the loop optical path 68. To avoid this possibility, wavelength location is preferably selected so that the group velocity of the control pulses and the group velocity of the first probe pulses become equal to each other.

The most effective wavelength location for minimizing the timing deviation is obtained by locating the wavelength $\lambda_s$ of the control pulses and the wavelength $\lambda_c$ of the first probe pulses in substantially symmetrical relationship with respect to the zero-dispersion wavelength of the loop optical path 68. Over a wide band near the zero-dispersion wavelength, the chromatic dispersion changes substantially linearly, so that a good phase matching condition can be obtained by making the group velocity of the signal pulses and the group velocity of the first probe pulses coincide with each other by the above-mentioned wavelength location.

However, if there are variations in the zero-dispersion wavelength itself along the fiber, the group velocities become different from each other in spite of the above wavelength location, causing a limit to a conversion band and a convertible signal rate. Thus, a conversion band by the fiber is limited by dispersion. If dispersion along the fiber is perfectly controlled, for example, if a fiber having a zero-dispersion wavelength uniform over the entire length (exactly, the nonlinear length) is fabricated, a conversion band infinite in fact (unlimitedly wide in a range where the wavelength dependence of dispersion is linear) could be obtained by locating the wavelength $\lambda_s$ of the waveform-shaped light and the wavelength $\lambda_c$ of the clock pulses in symmetrical relationship with respect to this uniform zero-dispersion wavelength. Actually, however, the zero-dispersion wavelength varies along the fiber, causing a deviation of the phase matching condition from an ideal condition to result in a limit of the conversion band.

A first method for realizing a wide conversion band is to use an HNL-DSF. In the case that the HNL-DSF is used, sufficient conversion can be achieved with a length of about 1 to 2 km, so that dispersion controllability can be improved to easily obtain a wide-band characteristic. In particular, by suppressing variations in the zero-dispersion wavelength near an input end where the efficiency of production of an optical Kerr effect is high, the conversion band can be widened most efficiently. Further, by cutting the fiber into a plurality of small sections and next joining any of the small sections similar in zero-dispersion wavelength by splicing or the like (in an order different from the initial order counted from a fiber end), a wide conversion band can be obtained although an average dispersion over the entire length is unchanged.

Alternatively, many fibers each having a length (e.g., hundreds of meters or less) allowing high-accuracy dispersion control required to obtain a sufficiently wide conversion band may be prepared in advance, and any of these fibers having a required zero-dispersion wavelength may be combined to be spliced, thereby fabricating a fiber having a length required to obtain a required conversion efficiency.

In the case of widening the conversion band as mentioned above, it is effective to gather the sections of the fiber having less variations in zero-dispersion wavelength near an input end where the light intensity is high. Further, the conversion band can be further widened by increasing the number of sections of the fiber as required, or by alternately arranging the positive and negative signs of dispersion at a relatively large-dispersion portion separate from the input end to thereby suitably combine the small sections.

The degree of reducing the length of each section in cutting the optical fiber may be based on the nonlinear length, for example. The phase matching in FWM in a fiber sufficiently shorter than the nonlinear length may be considered to depend on the average dispersion of the fiber. As an example, in FWM using a pump light power of about 30 mW in a fiber having a nonlinear coefficient $\gamma$ of 2.6 $W^{-1}km^{-1}$, the nonlinear length is about 12.8 km. In this example, the length of each section is set to about $\frac{1}{10}$ of 12.8 km, i.e., about 1 km. As another example, in FWM using a pump light power of about 30 mW in a fiber having a nonlinear coefficient $\gamma$ of 15 $W^{-1}km^{-1}$, the nonlinear length is about 2.2 km. In this example, the length of each section is set to about $\frac{1}{10}$ of 2.2 km, i.e., about 200 m. In any case, a wide conversion band can be obtained by measuring an average zero-dispersion wavelength of fiber sections each sufficiently shorter than the nonlinear length and combining any of the fiber sections having almost the same zero-dispersion wavelength to thereby configure a fiber achieving a required conversion efficiency.

In the preferred embodiment of the optical retiming section 36 shown in FIG. 9, the dispersion of the HNL-DSF used as the loop optical path 68 is preferably set so that no walk-off of two pulses (one of the pulses of the waveform-shaped light and one of the clock pulses) is generated. As an example, the zero-dispersion wavelength of the HNL-DSF is set near the middle between the wavelength $\lambda_o$ of the waveform-shaped light and the wavelength $\lambda_c$ of the clock pulses. Alternatively, the zero-dispersion wavelength may be set longer or shorter than the wavelengths of the two pulses. In the case that the zero-dispersion wavelength is set longer than the wavelengths of the two pulses, the dispersion of the HNL-DSF falls in a normal dispersive region, so that modulation instability effects can be suppressed. In the case that the zero-dispersion wavelength is set shorter than the wavelengths of the two pulses, the dispersion of the HNL-DSF falls in an anomalous dispersive region, so that soliton effects can be used. How the zero-dispersion wavelength is set may be determined according to actual system conditions.

Further, an optical filter, an optical amplifier, and an optical isolator may be provided upstream or downstream of the configuration shown in FIG. 7 or inside of the configuration shown in FIG. 7, as required.

Figure 10:
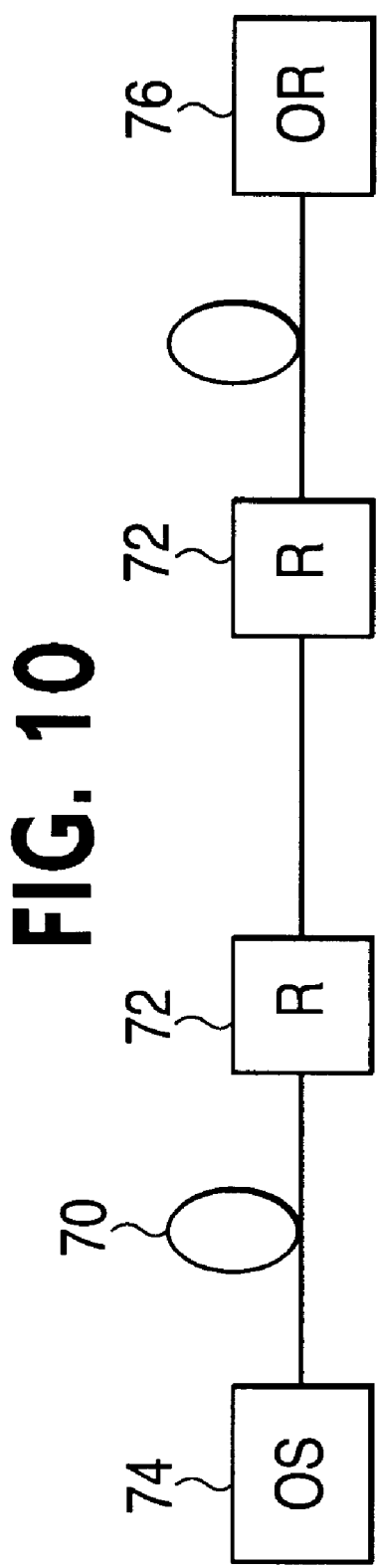
FIG. 10 is a block diagram showing a preferred embodiment of the system according to the present invention.

FIG. 10 is a block diagram showing a preferred embodiment of the system according to the present invention. This system includes an optical fiber transmission line 70 for transmitting signal light, and a plurality of optical repeaters (R) 72 (two being shown) arranged along the optical fiber transmission line 70. A single optical repeater may be used instead. Signal light is supplied from an optical sender (OS) 74 to the optical fiber transmission line 70, and the signal light transmitted by the optical fiber transmission line 70 is received by an optical receiver (OR) 76.

At least one of the above-mentioned preferred embodiments of the present invention may be applied to each optical repeater 72, thereby obtaining so-called 3R functions or 2R functions without the need for opto/electric conversion. The term of "3R" means Reshaping, Retiming, and Regeneration, and the term of "2R" means Reshaping and Regeneration. Particularly in the case that each optical repeater 72 includes an optical amplifier such as an EDFA, the ASE generated in the optical amplifier is accumulated in the system shown in FIG. 10. Therefore, the application of the present invention to each optical repeater 72 allows effective waveform shaping or all-optical signal regeneration.

Alternatively, the waveform shaping or all-optical signal regeneration according to the present invention may be performed at an output end of the optical fiber transmission line 70. In this case, at least one of the various preferred embodiments of the present invention is applied to the optical receiver 76. For enhancement of a receiver sensitivity, an optical amplifier such as an EDFA may be provided as an optical preamplifier in the optical receiver 76.

In the system shown in FIG. 10, there is a possibility that the waveform of the signal light may be distorted by dispersion or nonlinear optical effects in the optical fiber transmission line 70 or may be perturbed by the accumulation of ASE noise in the optical amplifiers during repeatered transmission. However, the waveform distortion of the signal light due to the dispersion or nonlinear optical effects can be prevented by providing a dispersion compensator or a nonlinear compensator in each optical repeater 72 or in the optical receiver 76. Further, the waveform perturbation due to the accumulation of ASE noise can be effectively prevented by performing the waveform shaping in accordance with the present invention. Accordingly, the combination of the present invention and a dispersion compensator or a nonlinear compensator is greatly effective in constructing a long-haul, ultra high-speed, and high-quality optical transmission system. The nonlinear compensator may be provided by a device employing phase conjugate conversion, for example.

The chromatic dispersion that is often referred to simply as dispersion is a phenomenon such that the group velocity of an optical signal in an optical fiber changes as a function of the wavelength (frequency) of the optical signal. In a standard single-mode fiber, for example, an optical signal having a longer wavelength propagates faster than an optical signal having a shorter wavelength in a wavelength region shorter than 1.3 $\mu$m, and the resultant dispersion is usually referred to as normal dispersion. In contrast, an optical signal having a shorter wavelength propagates faster than an optical signal having a longer wavelength in a wavelength region longer than 1.3 $\mu$m, and the resultant dispersion is usually referred to as anomalous dispersion.

In recent years, the nonlinearities of an optical fiber have received attention in association with an increase in optical signal power due to the use of an EDFA. The most important nonlinearity that limits a transmission capacity is an optical Kerr effect occurring in an optical fiber. The optical Kerr effect is a phenomenon such that the refractive index of an optical fiber changes with the intensity of an optical signal. A change in the refractive index modulates the phase of an optical signal propagating in an optical fiber, resulting in the occurrence of frequency chirping which changes a signal spectrum. This phenomenon is known as self-phase modulation (SPM). Spectral broadening due to SPM occurs to cause further enlargement of the waveform distortion due to chromatic dispersion.

In this manner, the chromatic dispersion and the optical Kerr effect impart waveform distortion to an optical signal with an increase in transmission distance. Accordingly, to allow long-haul transmission by an optical fiber, the chromatic dispersion and the nonlinearity must be controlled, compensated, or suppressed.

As a technique for controlling the chromatic dispersion and the nonlinearity, the use of a regenerative repeater including an electronic circuit for a main signal is known. For example, a plurality of regenerative repeaters are arranged along a transmission line. Each regenerative repeater performs opto/electric conversion, electric regeneration, and electro/optic conversion in this order before the waveform distortion of an optical signal becomes excessive. However, this method has a problem that the regenerative repeater required is expensive and complicated, and that the electronic circuit included in the regenerative repeater limits the bit rate of a main signal.

As a technique for compensating for the chromatic dispersion and the nonlinearity, optical soliton is known. An optical signal pulse having an amplitude, pulse width, and peak power each accurately specified with respect to a given anomalous dispersion is generated, thereby balancing pulse compression due to both SPM induced by the optical Kerr effect and the anomalous dispersion and pulse broadening due to dispersion, so that an optical soliton propagates as maintaining its waveform.

As another technique for compensating for the chromatic dispersion and the nonlinearity, the application of optical phase conjugation is known. For example, a method for compensating for the chromatic dispersion of a transmission line has been proposed by Yariv et al. (A. Yariv, O. Fekete, and D. M. Pepper, "Compensation for channel dispersion by nonlinear optical phase conjugation" Opt. Lett., vol. 4, pp. 52–54, 1979). An optical signal is converted into phase conjugate light at the midpoint of a transmission line, and the waveform distortion due to chromatic dispersion in the front half of the transmission line is compensated by the waveform distortion due to chromatic dispersion in the rear half of the transmission line.

In particular, if the causes of phase fluctuations of electric fields at two points are identical with each other, and an environmental change inducing these causes is gentle during a light propagation time between the two points, the phase fluctuations can be compensated by locating a phase conjugator (phase conjugate light generator) at the midpoint between the two points (S. Watanabe, "Compensation of phase fluctuation in a transmission line by optical conjugation" Opt. Lett., vol. 17, pp. 1355–1357, 1992). Accordingly, the waveform distortion due to SPM can also be compensated by adopting the phase conjugator. However, in the case that the optical power distributions on the upstream and downstream sides of the phase conjugator are asymmetrical with respect thereto, the compensation for nonlinearity becomes incomplete.

The present inventor have proposed a technique for overcoming the incompleteness of the compensation due to the asymmetry of optical powers in the case of using a phase conjugator (S. Watanabe and M. Shirasaki, "Exact compensation for both chromatic dispersion and Kerr effect in a transmission fiber using optical phase conjugation" J. Lightwave Technol., vol. 14, pp. 243–248, 1996). The phase conjugator is located in the vicinity of a point on a transmission line such that a total dispersion or total nonlinear effect in a portion of the transmission line upstream of this point is equal to that in a portion of the transmission line downstream of this point, and various parameters are set in each minute section of the upstream and downstream portions.

By using a third-order nonlinear optical medium such as an optical fiber and a semiconductor optical amplifier, phase conjugate light can be generated by nondegenerate four-wave mixing. When signal light having an angular frequency $\omega_s$ and pump light having an angular frequency $\omega_p$ ($\omega_p \neq \omega_o$) are supplied to the nonlinear optical medium, phase conjugate light (converted signal light) having an angular frequency $2\omega_p - \omega_o$ is generated by four-wave mixing based on the signal light and the pump light in the nonlinear optical medium, and this phase conjugate light is output together with the signal light and the pump light from the nonlinear optical medium.

The above term of "nondegenerate" used herein means that the wavelength of the signal light and the wavelength of the pump light are different from each other. Since the wavelength of the signal light, the wavelength of the pump light, and the wavelength (angular frequency) of the phase conjugate light satisfy the above-mentioned relation, wavelength conversion is performed simultaneously with the generation of the phase conjugate light. Accordingly, in the case that an HNL-DSF is used as the nonlinear optical medium for phase conjugate conversion and wavelength conversion, the above-mentioned discussion for obtaining a high conversion efficiency and a broad conversion band is applicable as it is, by adapting the term of "conversion" mentioned above to these conversions.

Figure 11:
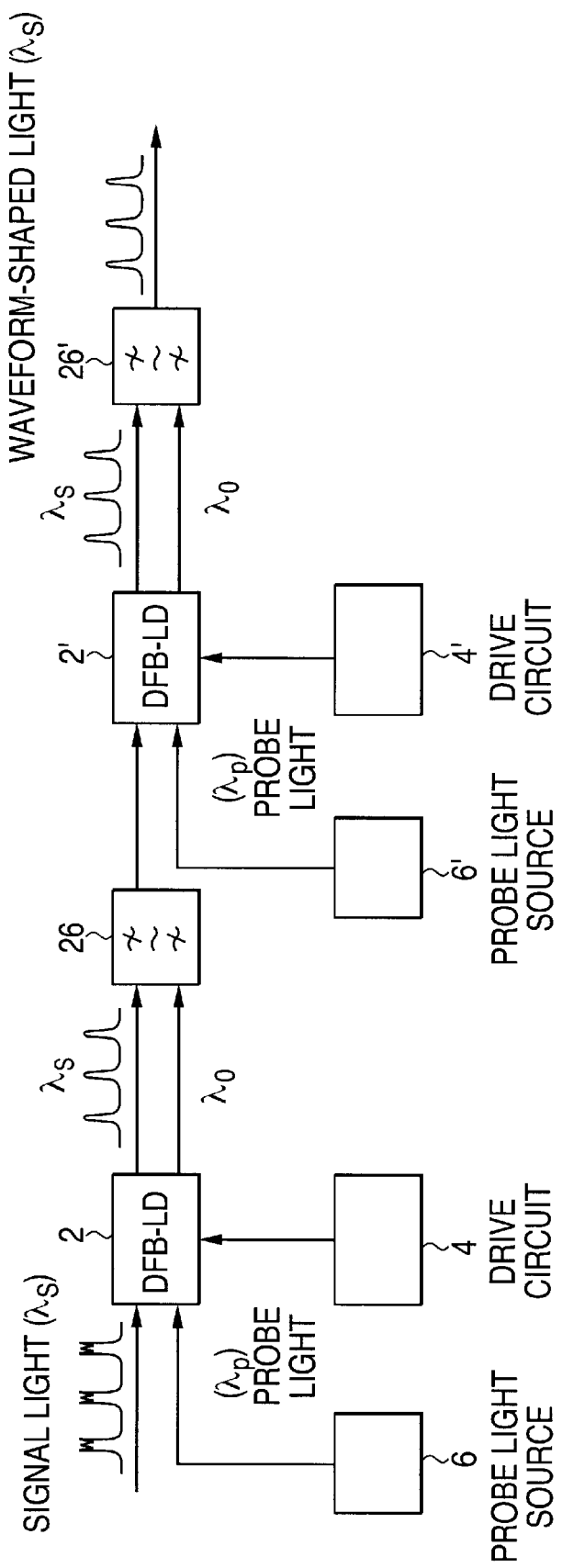
FIG. 11 is a block diagram showing a fourth preferred embodiment of the waveform shaper according to the present invention.

FIG. 11 is a block diagram showing a fourth preferred embodiment of the waveform shaper according to the present invention. This waveform shaper includes the DFB-LD 2, the drive circuit 4, the probe light source 6, and the optical filter 26 each shown in FIG. 6, and further includes a DFB-LD 2', a drive circuit 4', a probe light source 6', and an optical filter 26' respectively corresponding to the components 2, 4, 6, and 26. The DFB-LDs 2 and 2' are cascaded (or connected in tandem) in such a manner that the light output from the optical filter 26 is input into the DFB-LD 2'.

Since the two DFB-LDs 2 and 2' are cascaded in this preferred embodiment, the degree of waveform shaping can be improved as compared with the case of using a single DFB-LD.

Probe light is supplied from the probe light source 6 to the DFB-LD 2, so that the generation of oscillated laser light having a wavelength $\lambda_0$ can be effectively suppressed. In this case, the optical filter 26 may be omitted to input the light output from the DFB-LD 2 directly into the DFB-LD 2'. Accordingly, the probe light from the probe light source 6 is passed through the DFB-LD 2 and thereafter supplied also to the DFB-LD 2', so that the probe light source 6' may be omitted. If the generation of oscillated laser light having a wavelength $\lambda_0$ in the DFB-LD 2' is effectively suppressed in this case, the function required for the optical filter 26' is to remove the probe light having a wavelength $\lambda_p$.

Thus, it is possible to provide a waveform shaper which can effectively perform waveform shaping, by cascading a plurality of DFB-LDs to carry out the present invention.

While various preferred embodiments of the present invention using a DFB laser have been described, the present invention is not limited by the use of a DFB laser. That is, also in the case of using any lasers other than a DFB laser, a gain clamped condition can be obtained in relation to optical amplification, so that the waveform shaping of signal light can be performed as in the case of using a DFB laser. For example, a Fabry-Perot laser diode oscillating in multiple modes may be used to carry out the present invention. In this case, the laser diode has a plurality of laser oscillation wavelengths, and the wavelength of signal light to be subjected to waveform shaping is therefore set different from these laser oscillation wavelengths.

According to the present invention as described, above, it is possible to provide a novel method, device, and system for waveform shaping independent of the bit rate and pulse shape of signal light. As a result, various performance limits in the existing linear optical communication system can be broken down. The effects obtained by the specific preferred embodiments of the present invention have been described above, so the description thereof will be omitted herein.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method comprising:
   (a) providing, by a waveform shaper, a distributed feedback (DFB) laser having a stop band defined as a range of wavelengths allowing laser oscillation;
   (b) driving, by a drive circuit, said DFB laser so that said DFB laser oscillates at a first wavelength included in said stop band; and
   (c) inputting, by the distributed feedback laser, signal light having a second wavelength not included in said stop band into said DFB laser, wherein said signal light including a high level and a low level and said (c) comprising adjusting, by the distributed feedback laser, the power of said signal light so that amplitude fluctuations at said high level of said signal light are suppressed in said DFB laser.

2. A method according to claim 1, wherein said (b) comprises supplying, by the drive circuit, a constant drive current to said DFB laser.

3. A method according to claim 1, further comprising inputting control light, by a light source, having a third wavelength not included in said stop band into said DFB laser.

4. A method according to claim 3, wherein said control light includes a substantially constant power.

5. A method according to claim 1, wherein:
said DFB laser includes an output saturation characteristic; and
said signal light is subjected to waveform shaping according to said output saturation characteristic to obtain waveform-shaped light, which is output from said DFB laser.

6. A method according to claim 1, further comprising inputting light output from said DFB laser into a second DFB laser.

7. A method comprising:
(a) dividing, by an interferometer, signal light into first signal light and second signal light, wherein each of said first signal light and said second signal light includes a high level and a low level
(b) inputting, by a first optical path, said first signal light into a first distributed feedback (DFB) laser having a first output saturation characteristic, and adjusting, by the first DFB laser, the power of said first signal light so that amplitude fluctuations at said high level of said first signal light are suppressed in said first DFB laser;
(c) inputting, by a second optical path, said second signal light into a second distributed feedback (DFB) laser having a second output saturation characteristic different from said first output saturation characteristic, and adjusting, by the second DFB laser, the power of said second signal light so that amplitude fluctuations at said high level of said second signal light are suppressed in said second DFB laser; and
(d) combining, by the interferometer, first waveform-shaped light output from said first DFB laser according to said first output saturation characteristic and second waveform-shaped light output from said second DFB laser according to said second output saturation characteristic.

8. A method according to claim 7, further comprising imparting a phase shift to said second waveform-shaped light so that output signal light as a difference signal between said first waveform-shaped light and said second waveform-shaped light is obtained in said (d).

9. A device comprising:
a distributed feedback (DFB) laser having a stop band defined as a range of wavelengths allowing laser oscillation; and
a drive circuit supplying a drive current to said DFB laser so that said DFB laser oscillates at a first wavelength included in said stop band; wherein
signal light having a second wavelength not included in said stop band being input into said DFB laser;
said signal light includes a high level and a low level; and
the power of said signal light is adjusted so that amplitude fluctuations at said high level of said signal light are suppressed in said DFB laser.

10. A device according to claim 9, further comprising a light source inputting control light having a third wavelength not included in said stop band into said DFB laser.

11. A device according to claim 10, wherein the power of said control light is set so that an increase in noise at said low level of said signal light is suppressed.

12. A device according to claim 10, further comprising an optical filter optically connected to an output of said DFB laser, said optical filter having a passband including said second wavelength and not including said first and third wavelengths.

13. A device according to claim 9, further comprising an optical filter optically connected to an output of said DFB laser, said optical filter having a passband including said second wavelength and not including said first wavelength.

14. A device according to claim 9, further comprising a saturable absorber optically connected to at least one of an input and an output of said DFB laser.

15. A device according to claim 9, wherein:
said DFB laser comprises a first DFB laser having a first output saturation characteristic and a second DFB laser having a second output saturation characteristic; and
said device further comprises:
a first optical coupler dividing said signal light into first signal light to be input into said first DFB laser and second signal light to be input into said second DFB laser; and
a second optical coupler combining first waveform-shaped light output from said first DFB laser according to said first output saturation characteristic and second waveform-shaped light output from said second DFB laser according to said second output saturation characteristic.

16. A device according to claim 15, further comprising a phase shifter imparting a phase shift to said second waveform-shaped light so that output signal light is obtained as a difference signal between said first waveform-shaped light and said second waveform-shaped light.

17. A device comprising:
a first optical coupler dividing signal light into first signal light and second signal light, each of said first signal light and said second signal light including a high level and a low level;
a first distributed feedback (DFB) laser into which said first signal light is to be input, said first DFB laser having a first output saturation characteristic, and adjusting, by the first DFB laser, the power of said first signal light so that amplitude fluctuations at said high level of said first signal light are suppressed in said first DFB laser;
a second distributed feedback (DFB) laser into which said second signal light is to be input, said second DFB laser having a second output saturation characteristic different from said first output saturation characteristic, and adjusting, by the second DFB laser, the power of said second signal light so that amplitude fluctuations at said high level of said second signal light are suppressed in said second DFB laser; and
a second optical coupler combining first waveform-shaped light output from said first DFB laser according to said first output saturation characteristic and second waveform-shaped light output from said second DFB laser according to said second output saturation characteristic.

18. A device according to claim 17, further comprising a phase shifter imparting a phase shift to said second waveform-shaped light so that output signal light is obtained as a difference signal between said first waveform-shaped light and said second waveform-shaped light.

19. A device according to claim 17, wherein said first and second optical couplers are provided by a Mach-Zehnder interferometer formed on a waveguide substrate.

20. A device comprising:
an optical branch dividing signal light into first signal light and second signal light;

a waveform shaper receiving said first signal light and performing waveform shaping of said first signal light received to output resultant waveform-shaped light;

a clock regenerator receiving said second signal light and regenerating clock pulses according to said second signal light received; and an optical retiming section receiving said waveform-shaped light and said clock pulses and correcting the timing of said waveform-shaped light according to said clock pulses to output resultant regenerated signal light;

said waveform shaper comprising:

a distributed feedback (DFB) laser into which said first signal light is to be input, said DFB laser having a stop band defined as a range of wavelengths allowing laser oscillation; and a drive circuit supplying a drive current to said DFB laser so that said DFB laser oscillates at a first wavelength included in said stop band;

said signal light having a second wavelength not included in said stop band.

21. A device according to claim 20, wherein:

said clock regenerator comprises a mode-locked laser into which said second signal light is introduced; and said clock pulses are regenerated by mode locking of said mode-locked laser according to said second signal light.

22. A device according to claim 20, wherein said waveform shaper comprises a nonlinear optical loop mirror.

23. A system comprising:

an optical fiber transmission line transmitting signal light; and at least one optical repeater arranged along said optical fiber transmission line;

each of said at least one optical repeater comprising:

a distributed feedback (DFB) laser into which said signal light transmitted by said optical fiber transmission line is supplied, said DFB laser having a stop band defined as a range of wavelengths allowing laser oscillation; and a drive circuit supplying a drive current to said DFB laser so that said DFB laser oscillates at a first wavelength included in said stop band;

said signal light having a second wavelength not included in said stop band, wherein said signal light includes a high level and a low level, and the power of said signal light is adjusted so that amplitude fluctuations at said high level of said signal light are suppressed in said DFB laser.

24. A system comprising:

an optical fiber transmission line transmitting signal light; and an optical receiver connected to an output end of said optical fiber transmission line;

said optical receiver comprising:

a distributed feedback (DFB) laser into which said signal light transmitted by said optical fiber transmission line is supplied, said DFB laser having a stop band defined as a range of wavelengths allowing laser oscillation; and a drive circuit supplying a drive current to said DFB laser so that said DFB laser oscillates at a first wavelength included in said stop band;

said signal light having a second wavelength not included in said stop band, wherein said signal light includes a high level and a low level, and the power of said signal light is adjusted so that amplitude fluctuations at said high level of said signal light are suppressed in said DFB laser.

25. A device comprising:

a plurality of distributed feedback (DFB) lasers cascaded through respective optical filters so that signal light is passed therethrough;

each of said DFB lasers having a stop band defined as a range of wavelengths allowing laser oscillation; and each of said DFB lasers being driven, by a corresponding drive circuit, so as to oscillate at a first wavelength included in said stop band;

said signal light having a second wavelength not included in said stop band, wherein said signal light includes a high level and a low level, and the power of said signal light is set so that amplitude fluctuations at said high level of said signal light are suppressed in said DFB lasers.

26. A method comprising:

providing, by a waveform shaper, a distributed feedback (DFB) laser including an output saturation characteristic;

inputting, by said DFB laser, signal light into said DFB laser; and outputting, by said DFB laser, wavelength-shaped light obtained by waveform shaping of said signal light according to said output saturation characteristic, wherein said signal light including a high level and a low level and said inputting comprising adjusting, by the distributed feedback laser, the power of said signal light so that amplitude fluctuations at said high level of said signal light are suppressed In said DFB laser.

27. A method comprising:

oscillating by a distributed feedback (DFB) laser at a first wavelength;

inputting, by the DFB laser, signal light having a second wavelength different from said first wavelength into said DFB laser; and adjusting, by the DFB laser, the power of said signal light so that said signal light is subjected to waveform shaping in said DFB laser, said signal light including a high level and a low level; and the power of said signal light is adjusted so that amplitude fluctuations at said high level of said signal light are suppressed in said DFB laser.

28. A device comprising:

a distributed feedback (DFB) laser; and a drive circuit supplying a drive current to said DFB laser so that said DFB laser oscillates at a first wavelength;

signal light having a second wavelength different from said first wavelength being input into said DFB laser;

the power of said signal light being adjusted so that said signal light is subjected to waveform shaping in said DFB lasers, said signal light including a high level and a low level, and the power of said signal light is adjusted so that amplitude fluctuations at said high level of said signal light are suppressed in said DFB laser.

29. An optical waveform shaping method comprising:

supplying, by a drive circuit, a current to a laser diode so that said laser diode emits laser light; and inputting, by the laser diode, light having a wavelength different from the wavelength of said laser light emitted from said laser diode, into said laser diode to thereby perform optical waveform shaping, said input light including a high level and a low level and the power of said input light is adjusted so that amplitude fluctuations at said high level of said signal light are suppressed in said laser diode.

30. An optical waveform shaping device comprising:

a laser diode;

current supplying means for supplying a current to said laser diode so that said laser diode emits laser light; and light inputting means for inputting light having a wavelength different from the wavelength of said laser light emitted from said laser diode, into said laser diode, said input light including a high level and a low level and the power of said input light is adjusted so that amplitude fluctuations at said high level of said signal light are suppressed in said laser diode.

* * * * *

UNITED STATES PATENT AND TRADEMARK OFFICE
CERTIFICATE OF CORRECTION

PATENT NO. : 6,608,854 B1
DATED : August 19, 2003
INVENTOR(S) : Shigeki Watanabe It is certified that error appears in the above-identified patent and that said Letters Patent is hereby corrected as shown below:

Title page,
Item [56], References Cited, insert -- FOREIGN PATENT DOCUMENTS
                              EP 467266  1/1992
                              EP 772312  5/1997
                              EP 776103  5/1997 --.

Column 24,
Line 29, change "In" to -- in --.

Signed and Sealed this

Twenty-ninth Day of June, 2004

JON W. DUDAS
*Acting Director of the United States Patent and Trademark Office*